United States Patent
Tsai et al.

(10) Patent No.: US 7,786,771 B2
(45) Date of Patent: Aug. 31, 2010

(54) PHASE LOCK LOOP (PLL) WITH GAIN CONTROL

(75) Inventors: Tsung-Hsien Tsai, Hsin-Chu (TW); Tsung-Yang Hung, Jhubei (TW); Chien-Hung Chen, Taipei (TW); Min-Shueh Yuan, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/127,651

(22) Filed: May 27, 2008

(65) Prior Publication Data

US 2009/0295439 A1  Dec. 3, 2009

(51) Int. Cl.
*H03L 7/06* (2006.01)

(52) U.S. Cl. .................. 327/156; 327/147; 327/149; 327/158

(58) Field of Classification Search ............. 327/147, 327/149, 156, 158
See application file for complete search history.

(56) References Cited

U.S. PATENT DOCUMENTS

| | | | | |
|---|---|---|---|---|
| 4,990,847 A * | 2/1991 | Ishimaru et al. | ............. | 323/314 |
| 5,274,275 A * | 12/1993 | Colles | ............. | 327/77 |
| 5,329,187 A * | 7/1994 | Crispie et al. | ............. | 327/65 |
| 5,621,290 A * | 4/1997 | Heller et al. | ............. | 318/466 |
| 5,701,136 A * | 12/1997 | Huq et al. | ............. | 345/100 |
| 5,955,899 A * | 9/1999 | Afghahi | ............. | 327/65 |
| 6,094,101 A * | 7/2000 | Sander et al. | ............. | 331/17 |
| 6,288,666 B1 * | 9/2001 | Afghahi et al. | ............. | 341/158 |
| 6,825,696 B2 * | 11/2004 | Jaussi et al. | ............. | 327/55 |
| 6,826,246 B1 * | 11/2004 | Brown et al. | ............. | 375/376 |
| 6,970,046 B2 * | 11/2005 | Da Dalt et al. | ............. | 331/16 |
| 7,091,759 B2 * | 8/2006 | Sowlati et al. | ............. | 327/157 |
| 7,151,400 B2 * | 12/2006 | Chen | ............. | 327/333 |
| 7,180,377 B1 * | 2/2007 | Leong et al. | ............. | 331/17 |
| 7,224,213 B2 * | 5/2007 | Zhu et al. | ............. | 327/554 |
| 7,298,219 B2 * | 11/2007 | Dosho et al. | ............. | 331/16 |
| 7,355,462 B1 * | 4/2008 | Wong et al. | ............. | 327/156 |
| 7,411,452 B2 * | 8/2008 | Lu et al. | ............. | 330/253 |
| 7,492,849 B2 * | 2/2009 | On et al. | ............. | 375/376 |
| 7,529,533 B2 * | 5/2009 | Bellantoni | ............. | 455/334 |
| 7,567,132 B2 * | 7/2009 | Thompson | ............. | 331/16 |

(Continued)

OTHER PUBLICATIONS

Williams, S., et al., "An Improved CMOS Ring Oscillator PLL with Less than 4ps RMS Accumulated Jitter," Custom Integrated Curcuits Conference, IEEE, 2004, pp. 151-154.

*Primary Examiner*—Lincoln Donovan
*Assistant Examiner*—Adam D Houston
(74) *Attorney, Agent, or Firm*—Slater & Matsil, L.L.P.

(57) ABSTRACT

A Phase Lock Loop (PLL) with gain control is provided. The PLL has a dual-path configuration, where a first and a second VCO control voltage are generated in response to a phase or frequency difference between a PLL input signal and an output signal. The PLL comprises a dynamic voltage gain control (DVGC) unit and a voltage-to-current (V2I) unit, where the DVGC creates a baseline reference current in response to the first VCO control voltage and the V2I provides a substantially linear current in response to the second VCO control voltage. The currents from the DVGC and V2I are combined and fed into a current-controlled oscillator, which generates a PLL output frequency signal. Frequency gain of the VCO is substantially reduced, thus providing a PLL with improved tuning precision.

19 Claims, 16 Drawing Sheets

U.S. PATENT DOCUMENTS

| | | | |
|---|---|---|---|
| 7,613,267 B2 * | 11/2009 | Perrott et al. | 375/376 |
| 2005/0184788 A1 * | 8/2005 | Johansson et al. | 327/333 |
| 2006/0267644 A1 * | 11/2006 | Youssoufian et al. | 327/156 |
| 2007/0018700 A1 * | 1/2007 | Yen et al. | 327/156 |
| 2007/0126506 A1 * | 6/2007 | Lu et al. | 330/253 |
| 2007/0188194 A1 * | 8/2007 | Yang et al. | 326/80 |
| 2007/0247210 A1 * | 10/2007 | Maede et al. | 327/333 |
| 2008/0007314 A1 * | 1/2008 | Ricard et al. | 327/333 |
| 2008/0129355 A1 * | 6/2008 | Evstratov | 327/158 |
| 2008/0136483 A1 * | 6/2008 | Sanduleanu et al. | 327/218 |
| 2008/0164932 A1 * | 7/2008 | Welty | 327/333 |
| 2008/0316075 A1 * | 12/2008 | Hasegawa | 341/143 |
| 2009/0015338 A1 * | 1/2009 | Frey | 331/16 |
| 2009/0027104 A1 * | 1/2009 | Foley et al. | 327/333 |

* cited by examiner

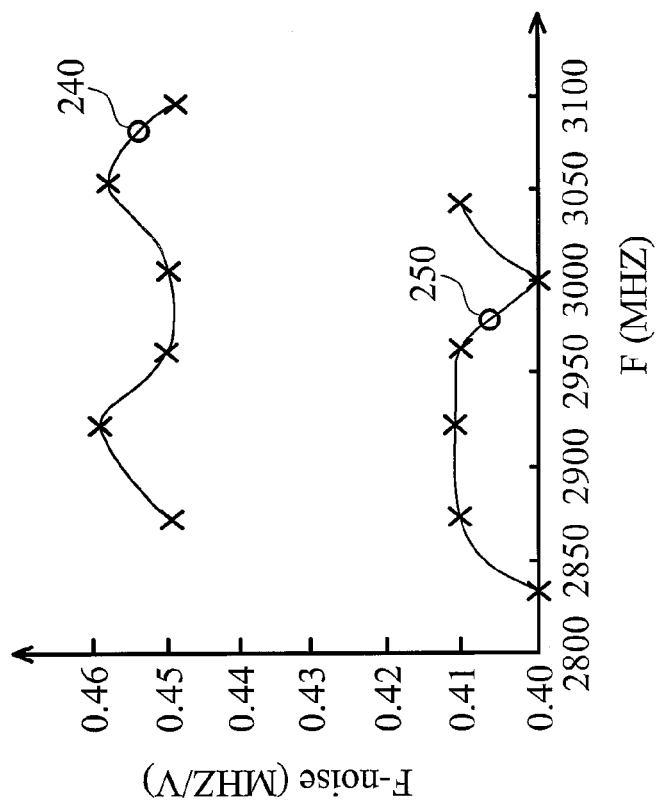
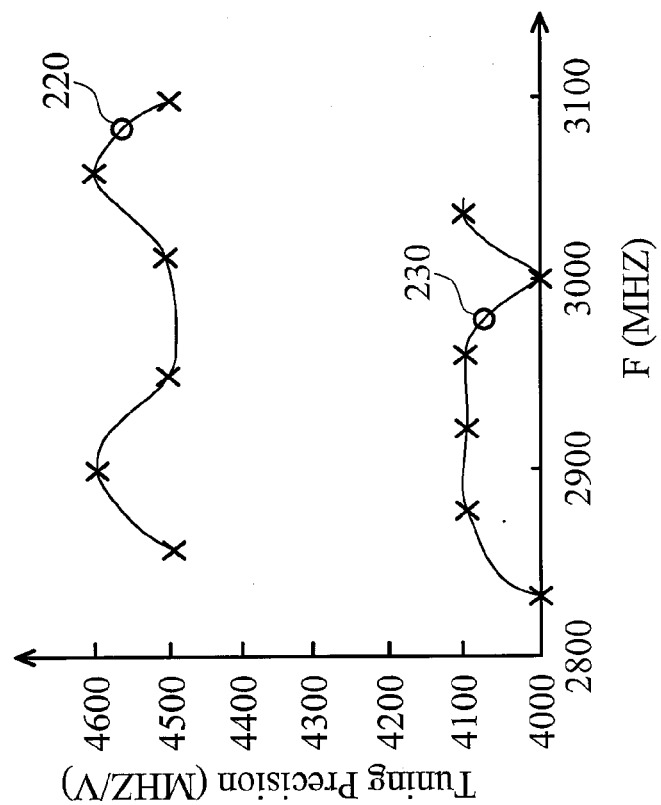
FIG. 6B
FIG. 6A

US 7,786,771 B2

PHASE LOCK LOOP (PLL) WITH GAIN CONTROL

TECHNICAL FIELD

The present invention relates generally to a structure for a voltage controlled oscillator (VCO) in a phase lock loop (PLL), and more particularly to a structure for a VCO with gain control.

BACKGROUND

A phase lock loop (PLL) is an electronic system that locks in phase and frequency of an output signal to the phase and frequency of an input signal. A PLL is widely employed in applications in communication systems, such as FM demodulators, stereo demodulators, tone detectors, and frequency synthesizers. A PLL is also commonly employed in digital applications that require a high-frequency periodic signal to synchronize the events between high-performance digital circuits. A PLL is particularly desirable to be implemented by advanced very-large-scale-integrated-circuit (VLSI) manufacturing technologies, and integrated with semiconductor integrated circuits (IC) for the various applications fields.

FIG. 1A is a system diagram illustrating the building blocks of an existing PLL, which generally is a nonlinear feedback circuit. The input signal $F_{in}$ is typically a periodic clock signal generated off chip from a reference clock source, such as a crystal oscillator. $F_{in}$ is compared with a local clock signal $F_{local}$, which is typically a divided version of the output signal $F_{out}$. The phase detector determines the relative phase difference between the two signals and outputs a signal that is proportional to this phase difference. The output signal from the phase detector is subsequently fed into a charge pump that converts the signal into an analog voltage $V_c$. This analog voltage is typically used as the VCO control signal. When there is a phase difference between the input signal $F_{in}$ and the local signal $F_{local}$, the value of this analog voltage may increase or decrease to speed up or slow down the VCO, which causes the local signal $F_{local}$ to catch up with the input signal $F_{in}$ or to eliminate the lead of the local signal $F_{local}$. When an automatic follow-up between the input signal $F_{in}$ and the local signal $F_{local}$ is achieved, the output signal $F_{out}$ is said to be locked on the input signal $F_{in}$. This behavior makes PLLs particularly useful in applications where an input signal contains desired information, whereas its frequency varies in time. In practice, the analog voltage $V_c$ generated by the charge pump first passes a loop filter, typically a low-pass filter, where the high-frequency components are removed from the VCO control signal. The dc component of $V_c$ is then fed into the VCO in order to reduce undesirable jitter in the output signal $F_{out}$.

FIG. 1B is a graph of an output frequency vs. control voltage of the VCO illustrated in FIG. 1A. The linear relationship between the frequency of the output signal $F_{out}$ and the magnitude of the VCO control signal $V_c$ may be expressed as the following equation:

$$F_{out} = K_{vco} \cdot V_c \qquad (1)$$

where $K_{vco}$ represents the slope of the linear output frequency vs. control voltage relationship, and is the constant VCO frequency gain. $F_{out}$ is the frequency change in the output signal in response to a VCO control signal $V_c$. As an example, a VCO in a PLL fabricated through a 0.25 μm processing technology has a constant frequency gain of about 0.25 MHz/mV, where one millivolt swing in the VCO control voltage translates into a quarter of one MHz frequency shift in the output signal $F_{out}$.

There are applications where a VCO with fine tuning precision of output frequency is desirable. A PLL having a VCO frequency gain such as that described above provides too coarse a tuning precision to meet the requirements of these applications. Thus, a PLL have a significantly reduced VCO frequency gain is also desirable.

SUMMARY OF THE INVENTION

These and other problems are generally solved or circumvented, and technical advantages are generally achieved, by preferred embodiments of the present invention which provide a Phase Lock Loop (PLL) with gain control. The PLL has a dual-path configuration, where a first and a second VCO control voltage are generated in response to a phase or frequency difference between a PLL input signal and an output signal. The PLL comprises a dynamic voltage gain control (DVGC) unit and a voltage-to-current (V2I) unit, where the DVGC creates a baseline reference current in response to the first VCO control voltage and the V2I provides a substantially linear current in response to the second VCO control voltage. The currents from the DVGC and V2I are combined and fed into a current-controlled oscillator, which generates a PLL output frequency signal. Frequency gain of the VCO is substantially reduced, thus providing a PLL with improved tuning precision.

In accordance with a preferred embodiment of the present invention, a phase lock loop (PLL) circuit comprises a phase detector configured to generate a control signal representing a frequency difference between a PLL input signal and an output signal. The phase lock loop circuit also comprises a loop filter configured to generate first and second voltage signals in response to the control signal. The phase lock loop circuit further comprises a voltage controlled oscillator (VCO) configured to modify a frequency of the output signal in response to the first and second voltage signals.

In accordance with another preferred embodiment of the present invention, a voltage controlled oscillator (VCO) comprises a dynamic voltage gain control (DVGC) unit configured to generate a first current, and a voltage-to-current unit configured to generate a second current. The first current varies insignificantly in response to a first voltage signal, while the second current varies substantially linearly in response to a second voltage signal.

In accordance with a further preferred embodiment of the present invention, a phase lock loop (PLL) comprises a loop filter configured to provide a first and a second voltage signal in response to an input control voltage, and a voltage controlled oscillator (VCO) configured to generate a PLL output frequency signal in response to the first voltage signal and the second voltage signal. The input control voltage varies in response to a relative phase of a PLL input frequency signal and the PLL output frequency signal.

BRIEF DESCRIPTION OF THE DRAWINGS

For a more complete understanding of the present invention, and the advantages thereof, reference is now made to the following descriptions taken in conjunction with the accompanying drawing, in which:

FIG. 6A compares the tuning precision of a prior art PLL and PLL of an illustrative embodiment;

FIG. 6B compares the noise characteristics of a prior art PLL and PLL of an illustrative embodiment;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely phase lock loops (PLLs) with a voltage controlled oscillator (VCO) that has a reduced VCO frequency gain, providing an improved tuning precision in the VCO output signal frequency in correspondence with a VCO control voltage within a broad tuning range. Embodiments of the present invention may also be applied, however, to VCO structures used in other applications where improved tuning precision in the VCO output signal frequency is desired. While CMOS processing technology is employed to fabricate the VCOs and PLLs in the preferred embodiments, other suitable processing technologies, such as bipolar and BiCMOS, may be also used to implement PLLs in the preferred embodiments.

Figure 2A:
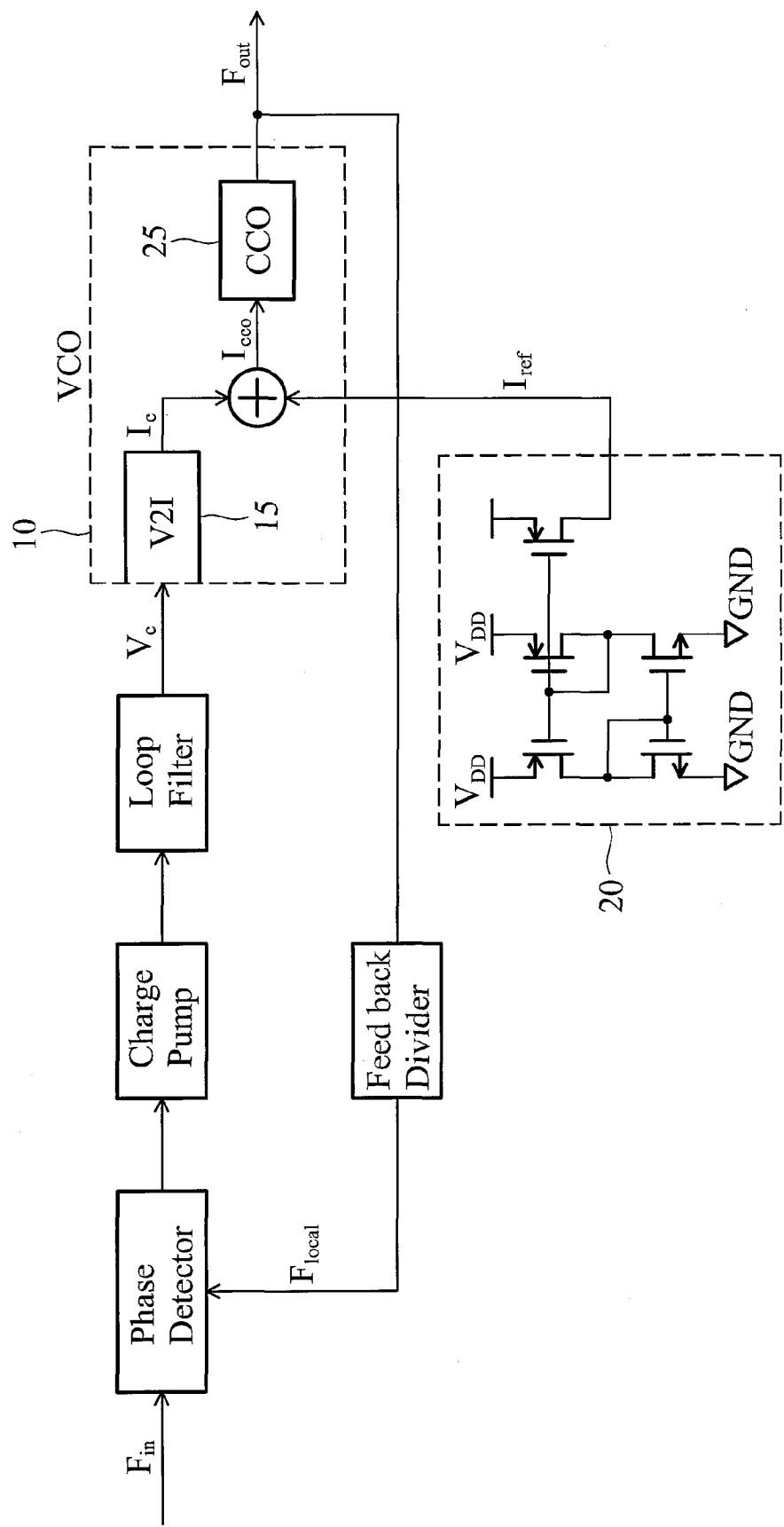
FIGS. 2A and 2B illustrate a block diagram and frequency gain of a prior art PLL.

FIG. 2A shows a block diagram of a prior art PLL where VCO 10 is configured to provide a reduced VCO gain (e.g., $K_{vco}$), thus enabling improved output signal $F_{out}$ frequency tuning precision. VCO 10 comprises a voltage-to-current converter 15. Voltage-to-current converter 15 is configured to generate a dc current $I_c$ in response to the VCO control signal $V_c$ that is typically generated from the loop filter. VCO 10 also comprises current controlled oscillator (CCO) 25, which is configured to generate the output signal $F_{out}$ in response to an input dc control current. As an attempt to reduce the frequency gain of VCO 10, an independent current source, such as a known constant $G_m$ current source 20 as shown, is implemented to provide a constant dc current $I_{ref}$ to VCO 10. $I_c$ and $I_{ref}$ are combined in VCO 10, and the combined current $I_{cco}$ is subsequently fed into CCO 25. Under this prior art VCO configuration, the frequency of output signal $F_{out}$ varies in response to $I_{cco}$. Even if a null control signal $V_{cont}$ is provided to VCO 10, the VCO still outputs an offset frequency signal that corresponds to the constant dc current $I_{ref}$ generated from current source 20.

Figure 2B:
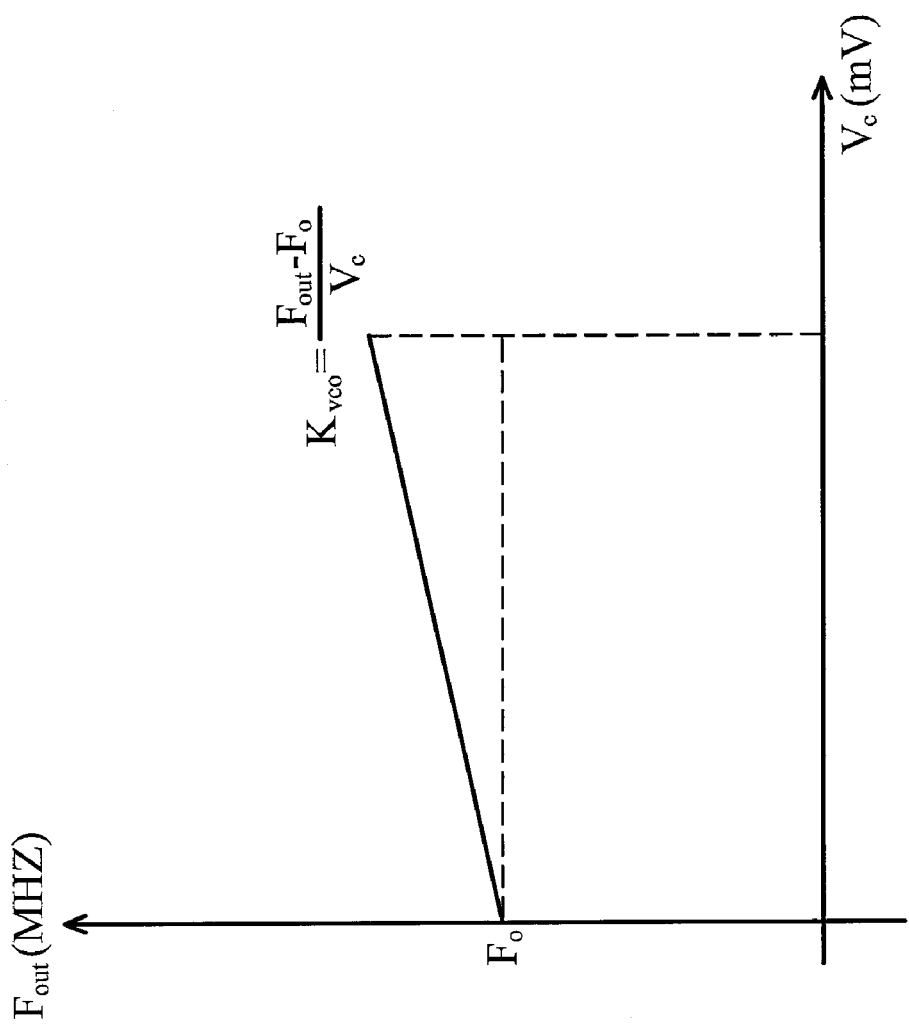

FIG. 2B shows a linear frequency gain of VCO 10 illustrated in FIG. 2A. The linear relationship between the output frequency signal $F_{out}$ and the magnitude of the VCO control signal $V_c$ may be expressed as the following equation:

$$F_{out}=K_{vco} \cdot V_c+F_o \quad (2)$$

where $F_o$ is the VCO output signal frequency when no VCO control signal is provided to VCO 10. $K_{vco}$ represents the slope of the linear output frequency $F_{out}$ vs. VCO control voltage $V_c$. $K_{vco}$ is a constant VCO frequency gain under the current prior art VCO configuration, which may be significantly smaller than that of a counterpart VCO without output signal frequency offset $F_o$.

Although prior art VCO 10 provides reduced VCO frequency gain, it has drawbacks in at least the following aspects. Firstly, implementing constant $G_m$ current source 20 requires an increased PLL die area, which is typically undesirable in advanced technology. Secondly, a PLL is an analog circuit that is inherently sensitive to noise and interface. Implementing constant $G_m$ current source 20 may introduce noise into VCO 10 that may result in jitter in the resulting output frequency signal. Moreover, it is difficult to remedy the noise thus introduced into the VCO because current source 20 is an open loop system, independent from the PLL feedback loop. The automatic remedy mechanism typically provided by a feedback loop is not viable for this prior art VCO configuration. Thirdly, implementing constant $G_m$ current source 20 into VCO 10 may have a negative impact on the operational stability of a pre-fine-tuned feedback system of a PLL. Frequency compensation involving addition of circuit elements is typically required to avoid the stability problem stemmed from adding constant $G_m$ current source 20 into a pre-designed PLL.

Figure 3:
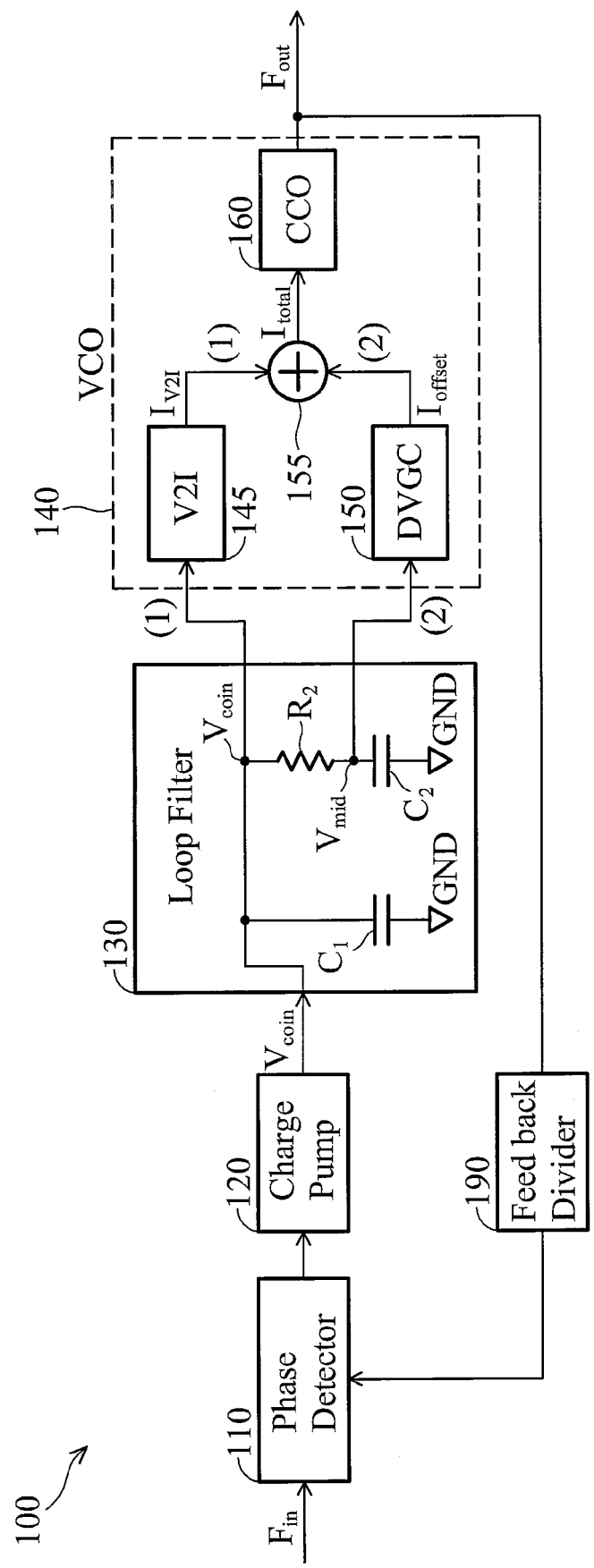
FIG. 3 is a block diagram of a PLL of an illustrative embodiment.

FIG. 3 illustrates a block diagram of PLL 100 in accordance with a preferred embodiment of the present invention. PLL 100 comprises phase detector 110, charge pump 120, loop filter 130, VCO 140, and feedback divider 190. Loop filter 130 is preferably a low-pass filter that extracts the dc component of the input analog voltage signal $V_{coin}$ from charge pump 120, applying an output voltage $V_{mid}$ to VCO 140. In one preferred embodiment, a low-pass filter 130 comprises a circuit between the input voltage signal $V_{coin}$ and the ground GND, and the circuit includes a first capacitance C1, a resistance R2 and a second capacitance C2 in a "$\pi$" configuration. R2 has a resistance of about 10 k; C1 has a capacitance of about 7 pF; C2 has a capacitance of about 120 pF, significantly great than C1. VCO 140 comprises a voltage-to-current converter 145. Voltage-to-current converter (V2I) 145 is configured to generate a dc current $I_{v2i}$ in response to a first VCO control signal $V_{coin}$ that is generated from charge pump 120 and coupled to VCO 140 via loop filter 130. It is noted that $V_{coin}$ is substantially free of ac components after passing through C1 of loop filter 130. VCO 140 also comprises dynamic voltage gain control (DVGC) unit 150 that is implemented to provide a dc current $I_{offset}$ in response to a second VCO control signal $V_{mid}$ that is the output voltage from loop filter 130. Similarly, $V_{mid}$ is substantially free of ac components due to low-pass filter 130. The dc current $I_{v2i}$ and $I_{offset}$ are combined at node 155 in VCO 140, and the combined current $I_{total}$ is fed into CCO 160 that converts current $I_{total}$ into an output frequency signal $F_{out}$. In short, VCO 140 in preferred embodiments is configured to respond to control signals from two signal paths (denoted as path (1) and (2) in FIG. 3), where path (1) is configured to take VCO control signal $V_{coin}$, and path (2) is configured to take loop filter output signal $V_{mid}$. CCO 160 is configured to accept the combined control current $I_{total}$ from V2I 145 and DVGC 150. PLL 100 is therefore configured to generate the frequency signal $F_{out}$ in response to the control signals $V_{coin}$ and $V_{mid}$. PLL 100 thus has a dual path configuration, in contrast with a prior art PLL with single path configuration as shown, for example, in FIG. 1A. This is also in contrast with the prior art PLL shown in FIG. 2A where, although an additional current path $I_{ref}$ is fed into the VCO, this current path is outside of the feedback loop of the PLL.

Figure 4A:
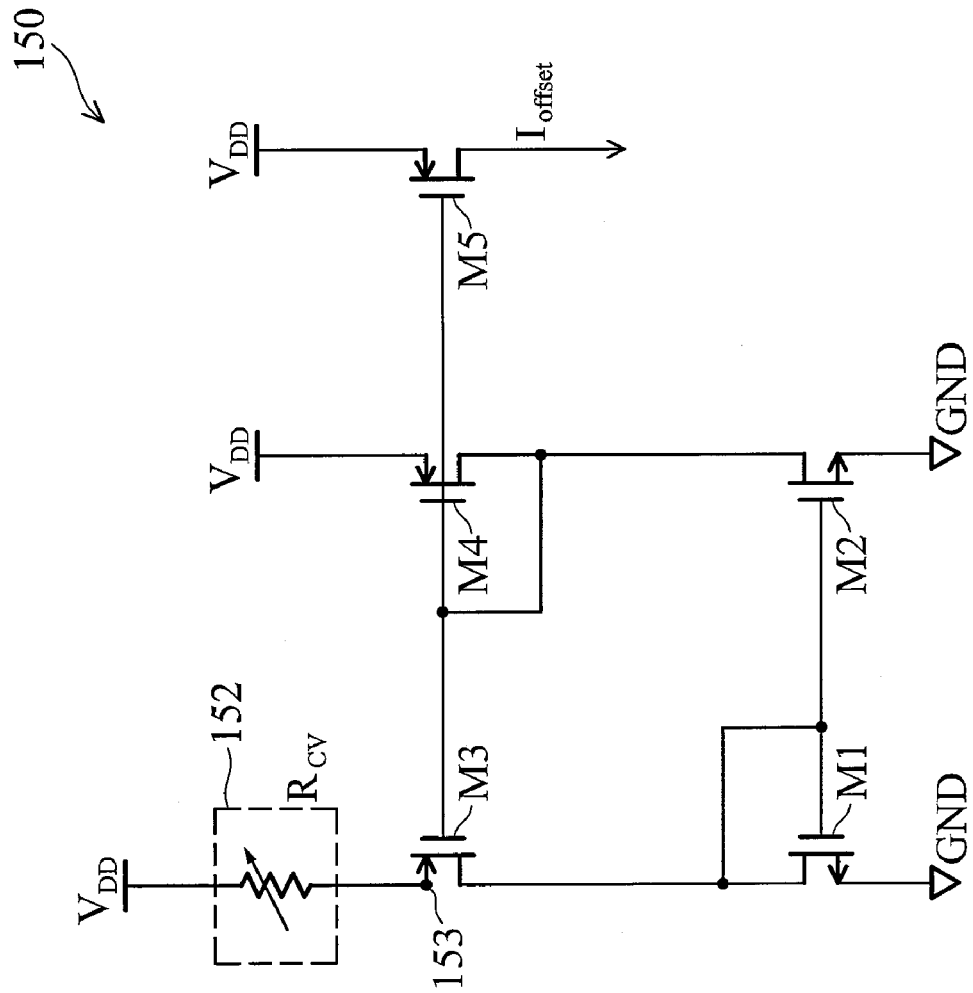
FIGS. 4A and 4B illustrate a schematic diagram of a dynamic voltage gain control (DVGC) of an illustrative embodiment.

FIG. 4A illustrates one exemplary schematic diagram of DVGC 150 of PLL 100. DVGC 150 is a tunable current source that provides a variable dc current $I_{offset}$ in response to control signal $V_{mid}$. Preferably, DVGC 150 exhibits at least the following characteristics: the output current $I_{offset}$ being substantially independent of the supply voltage, the output current $I_{offset}$ being substantially independent of variations of manufacturing process and operational temperature, the transconductance Gm of the transistors in DVGC 150 being substantially independent of variations of supply voltage, manufacturing process, and operational temperature. In the current embodiment, DVGC 150 is implemented through a complementary metal-oxide-semiconductor (CMOS) process technology, and comprises a pair of NMOSFETs M1 and M2, a pair of PMOSFETs M3 and M4, a variable resistor Rcv 152, and an additional PMOSFET M5. The sources of M1 and M2 are connected to ground GND. The drains of M1 and M2 are connected to the drains of M3 and M4, respectively. The gate and the drain of M1, and the gate of M2 are tied together. One terminal of variable resistor Rcv is connected to supply voltage $V_{DD}$, and another terminal 153 of Rcv is connected to the source of M3. The sources of M4 and M5 are connected to voltage supply $V_{DD}$. The gates of M3, M4, and M5, and the drain of M4 are tied together. In the current embodiment of PLL 100, $V_{DD}$ is equal to 2.5 V, although other suitable voltage supplies may be also used.

Figure 4B:
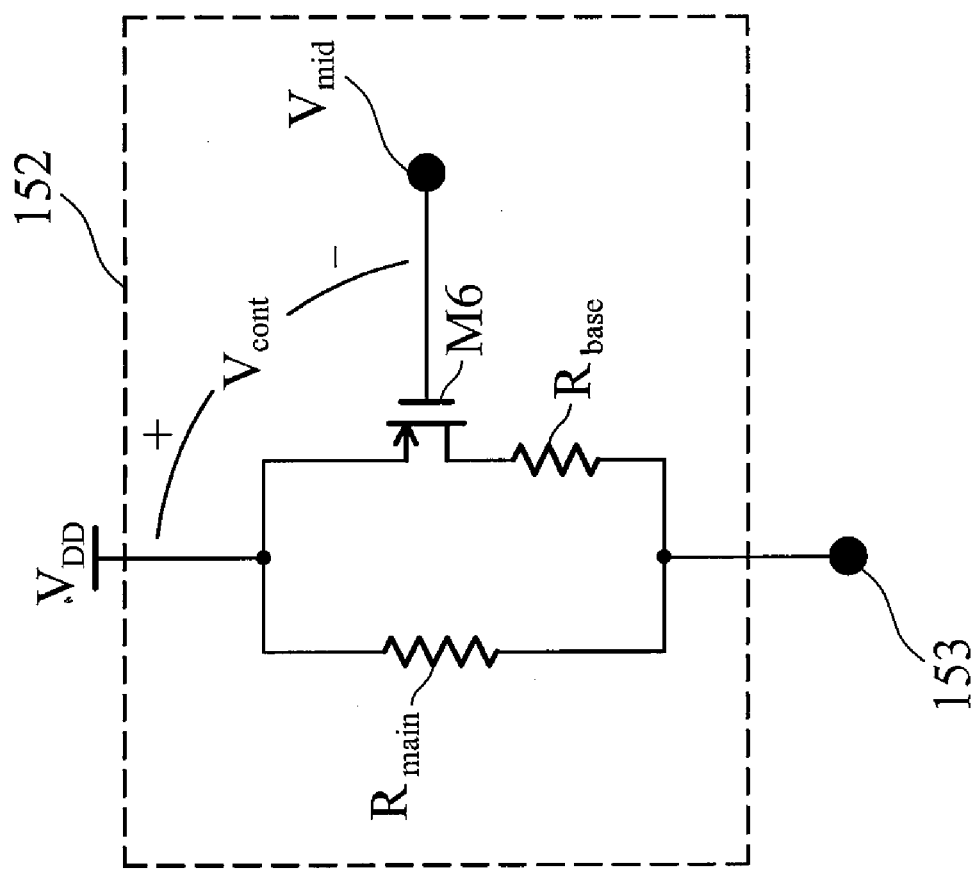

FIG. 4B illustrates a further detailed schematic diagram of variable resistor Rcv 152. Rcv 152 is implemented between supply voltage $V_{DD}$ and the source 153 of PMOSFET M3. Rcv 152 comprises a first branch with resistor $R_{main}$ in parallel with a second branch with PMOSFET M6 and resistor $R_{base}$. One terminal of $R_{main}$ and the source of M6 are connected to the supply voltage $V_{DD}$. The drain of M6 is connected to one terminal of $R_{base}$. The other terminals of $R_{main}$ and $R_{base}$ are connected the source 153 of M3. The gate of M6 is coupled to the output node of low pass filter 130, where signal $V_{mid}$ is presented. The resistance of Rcv 152 is the resistance of the first branch in parallel with the resistance of the second branch, and can be expressed as the following:

$$Rcv = R_{main} \| (R_{base} + R_{mos}) \quad (3)$$

where $R_{main}$ and $R_{base}$ have an intermediate resistance of about 3 KΩ and 2 KΩ, respectively. $R_{mos}$ is the resistance of PMOSFET M6 that varies in response to the gate-to-source voltage $V_{GS}$ of M6, which is also referred to as DVGC 150 control signal $V_{cont}$. $V_{cont}$ represents the difference between $V_{DD}$ and $V_{mid}$ (i.e., $V_{cont} = V_{DD} - V_{mid}$). $V_{cont}$ varies in response to $V_{mid}$ presented on the gate of M6, and in turn, $V_{mid}$ varies in respond to the variation of signal $V_{coin}$ from charge pump 120. M6 operates in different operating regions in response to the magnitude of $V_{mid}$. When $V_{cont}$ is below the threshold voltage of M6, M6 is turned off and operates in the cutoff region. M6 is turned on and operates in the saturation region when $V_{cont}$ increases and becomes greater than the threshold voltage of M6. M6 enters triode (linear) operating region when $V_{cont}$ continues to increase. When M6 operates across the aforementioned operating regions, $R_{mos}$ is reduced from an upper bound large resistance to a lower bound small resistance. Consequently, Rcv 152 varies in response to the variation of $R_{mos}$, and as a result, output dc current $I_{offset}$ on PMOSFET M5 of DVGC 150 varies in response to the variation of Rcv. In the current DVGC configuration, control voltage $V_{cont}$ is referred to as being $V_{mid}$ referenced to the supply voltage $V_{DD}$.

Figure 4C:
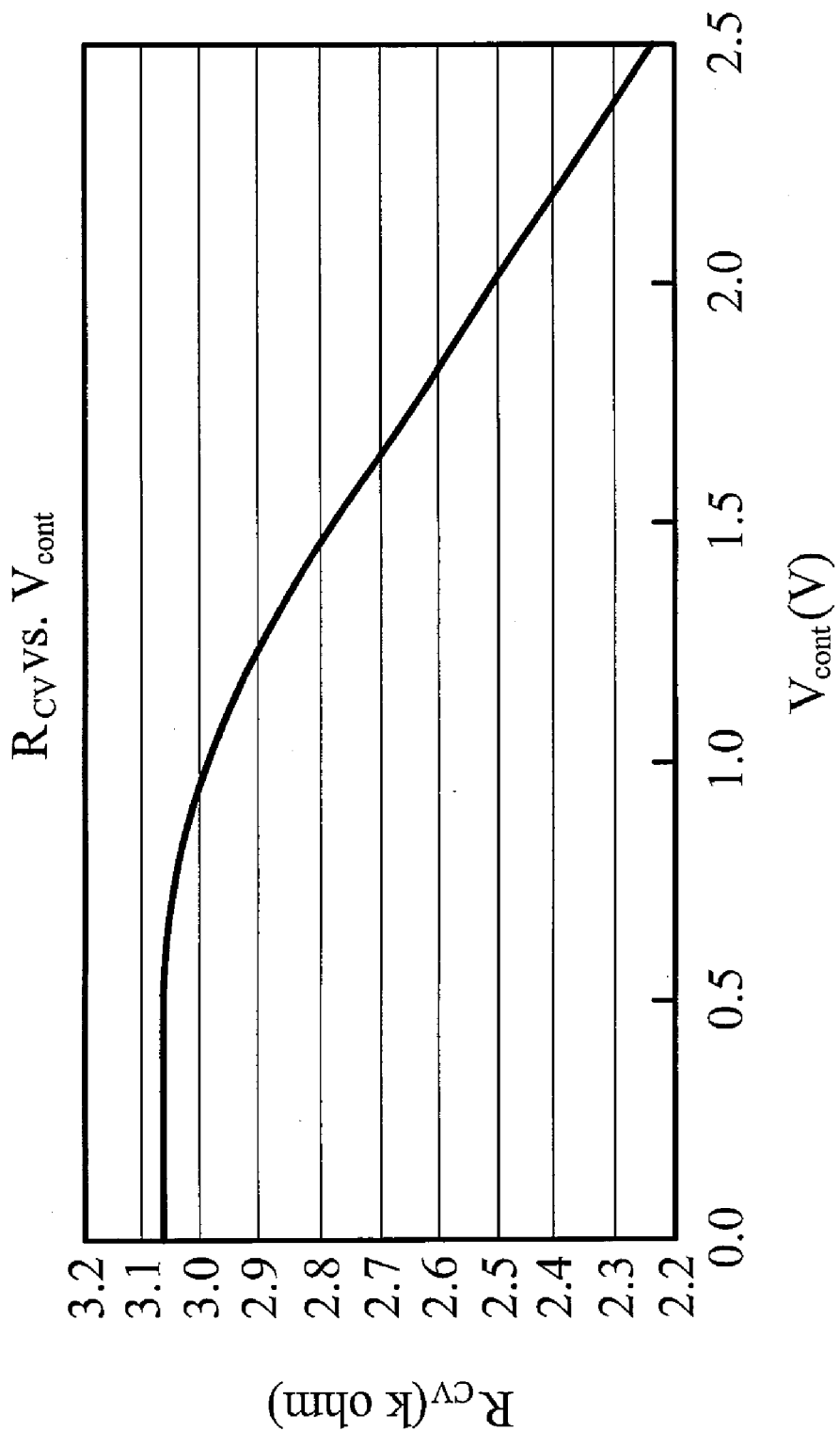
FIGS. 4C and 4D illustrate the operating characteristics of DVGC of an illustrative embodiment.

FIG. 4C illustrates the relationship between $V_{cont}$ and variable resistor $R_{cv}$ under the current $R_{cv}$ configuration. It is shown that $R_{cv}$ remains at a substantially constant, upper bound value of about 3.05 KΩ, for example, when $V_{cont}$ is below the threshold voltage 0.8V of M6. This corresponds to an upper bound VCO control signal $V_{mid}$ close to $V_{DD}$. $R_{cv}$ is reduced linearly when $V_{cont}$ is greater than 0.8 V. $R_{cv}$ reaches a lower bound value of about 2.25 KΩ, for example, when $V_{cont}$ reaches its upper limit, which corresponds to a lower bound control signal $V_{mid}$ of about 1.2 V.

Figure 4D:
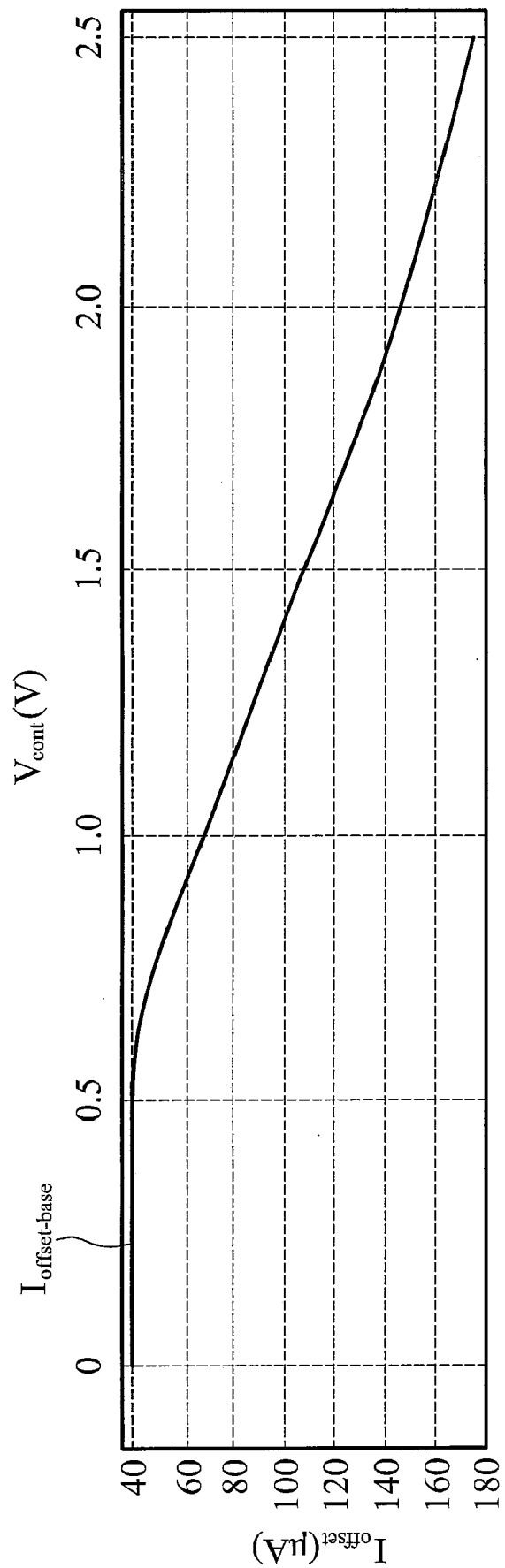

FIG. 4D is a graph illustrating the operating characteristics of DVGC 150 in the current embodiment. The output current $I_{offset}$ of DVGC 150 is plotted versus control signal $V_{cont}$. It is shown that, when $V_{cont}$ is below the threshold voltage 0.8V of M6, $I_{offset}$ remains at a lower bound, baseline current offset base of about 40 μA, for example. $I_{offset}$ is increased linearly when $V_{cont}$ is greater than 0.8 V. $I_{offset}$ reaches an upper bound value of about 170 μA, for example, when $V_{cont}$ reaches its upper limit.

Figure 5A:
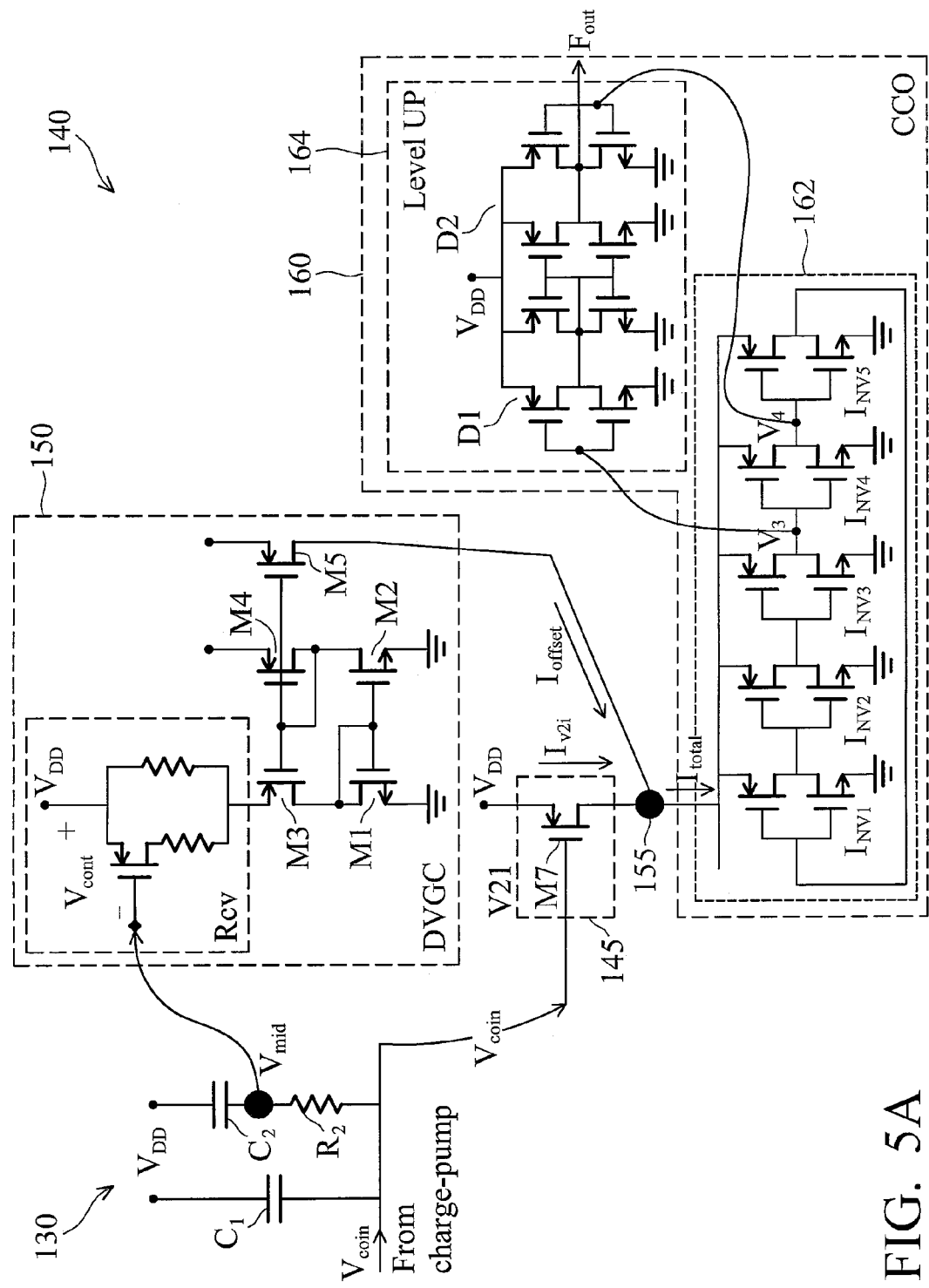
FIG. 5A illustrates a detailed schematic diagram of an voltage-controlled oscillator (VCO) of an illustrative embodiment.

FIG. 5A illustrates a detailed schematic diagram of loop filter 130 and VCO 140 implemented with, among others, V2I 145, DVGC 150, and CCO 160. V2I 145 comprises PMOSFET M7 that is implemented to convert the first VCO control signal $V_{coin}$ into a dc current $I_{v2i}$. The source of M7 is connected to supply voltage $V_{DD}$; the gate of M7 is coupled to the first VCO control signal $V_{coin}$. Within the desired operating range of $V_{coin}$, between 0 V and 2.5 V, for example, M7 is configured to produce a continuous and substantially linear current $I_{v2i}$ proportional to $V_{coin}$. The current $I_{v2i}$ is coupled to node 155 through the drain of M7. Similarly, the current $I_{offset}$ generated on PMOSFET M5 of DVGC 150 is also coupled to node 155. Current $I_{v2i}$ from V2I 145 and $I_{offset}$ from DVGC 150 are combined at node 150 to form CCO control current $I_{total}$. $I_{total}$ is subsequently fed into CCO 160 and converted into output frequency signal $F_{out}$ of PLL 100.

In the current embodiment, CCO 160 is implemented using a CMOS process technology, and comprises a CMOS ring oscillator 162 and a "level up" unit 164. Ring oscillator 162 comprises a chain of five CMOS inverters INV1 through INV5. The sources of the PMOSFETs of inverters INV1 through INV5 are coupled to node 155. The drains of the NMOSFETs of inverters INV1 through INV5 are coupled to GND. The voltage at the output stage of INV5 is fed back to the input stage of INV1. "Level up" unit 164 comprises two cascaded differential pairs D1 and D2. The output signal V3 from INV3 and the output signal V4 are coupled to the differential pairs D1 and D2, respectively. "Level up" unit 164 is configured to convert the voltage difference between V3 and V4 into an output frequency signal $F_{out}$ at the output node of differential pair D2. Although a CMOS process technology is used to implement CCO 160 in the above example, it is noted, however, that other suitable process technologies, such as a bipolar process, and other CCO configurations may be also used to convert $I_{total}$ into output frequency signal $F_{out}$.

Figure 1A:
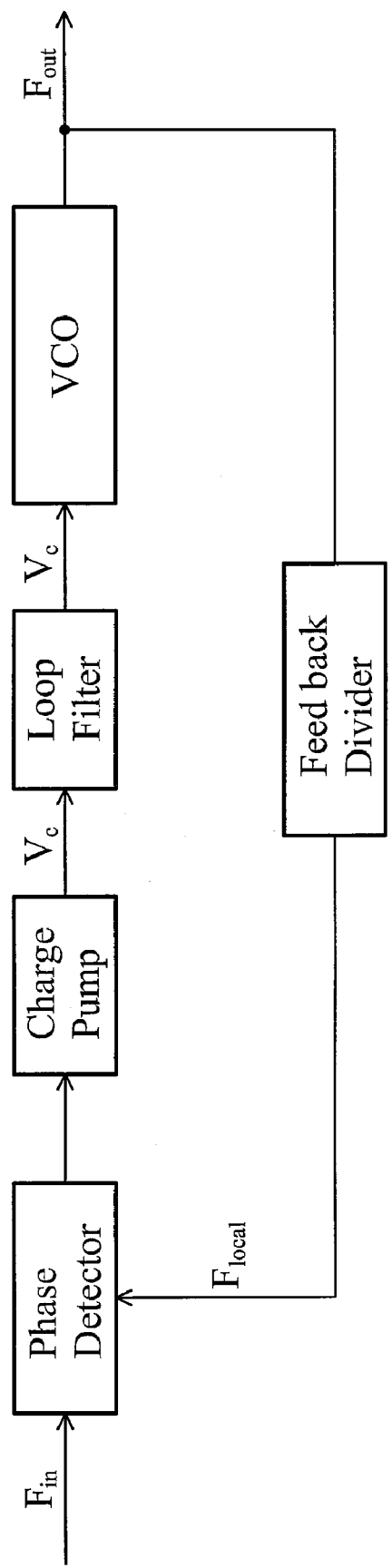
FIGS. 1A and 1B illustrate a block diagram and frequency gain of a prior art PLL.
Figure 1B:
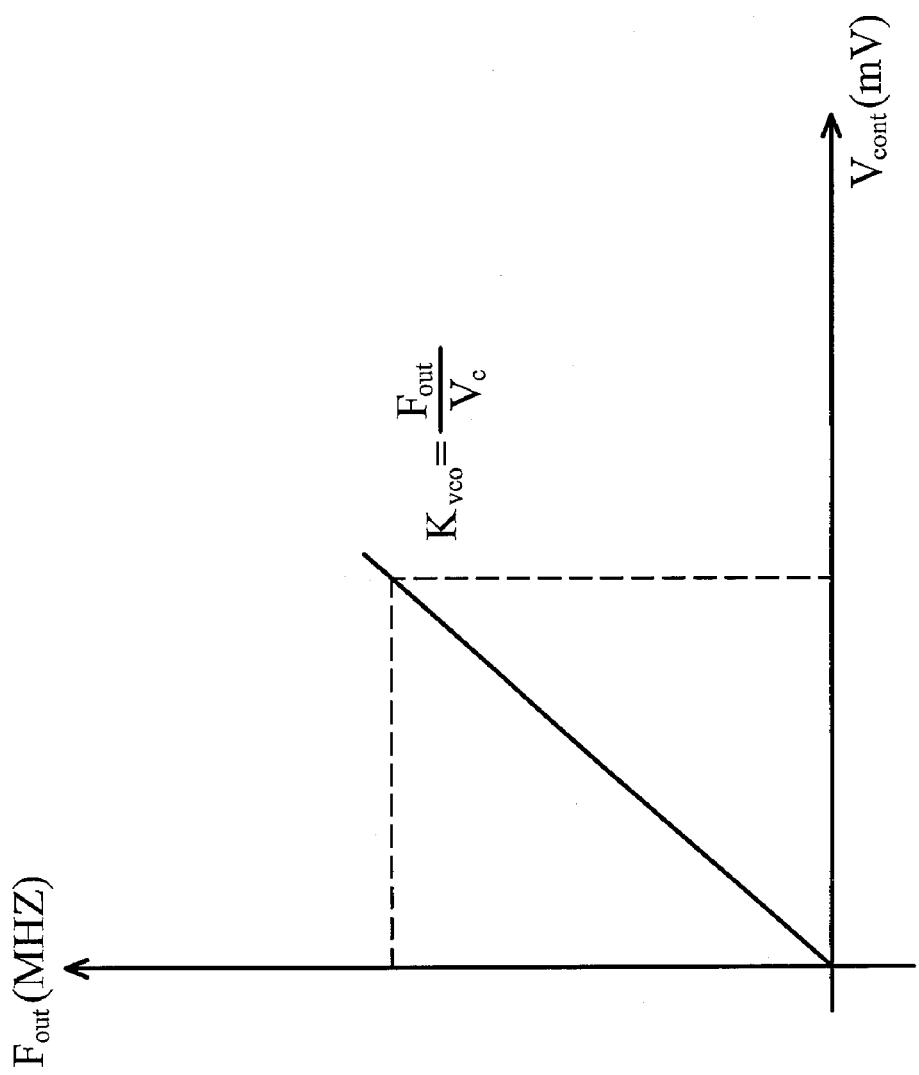
Figure 5B:
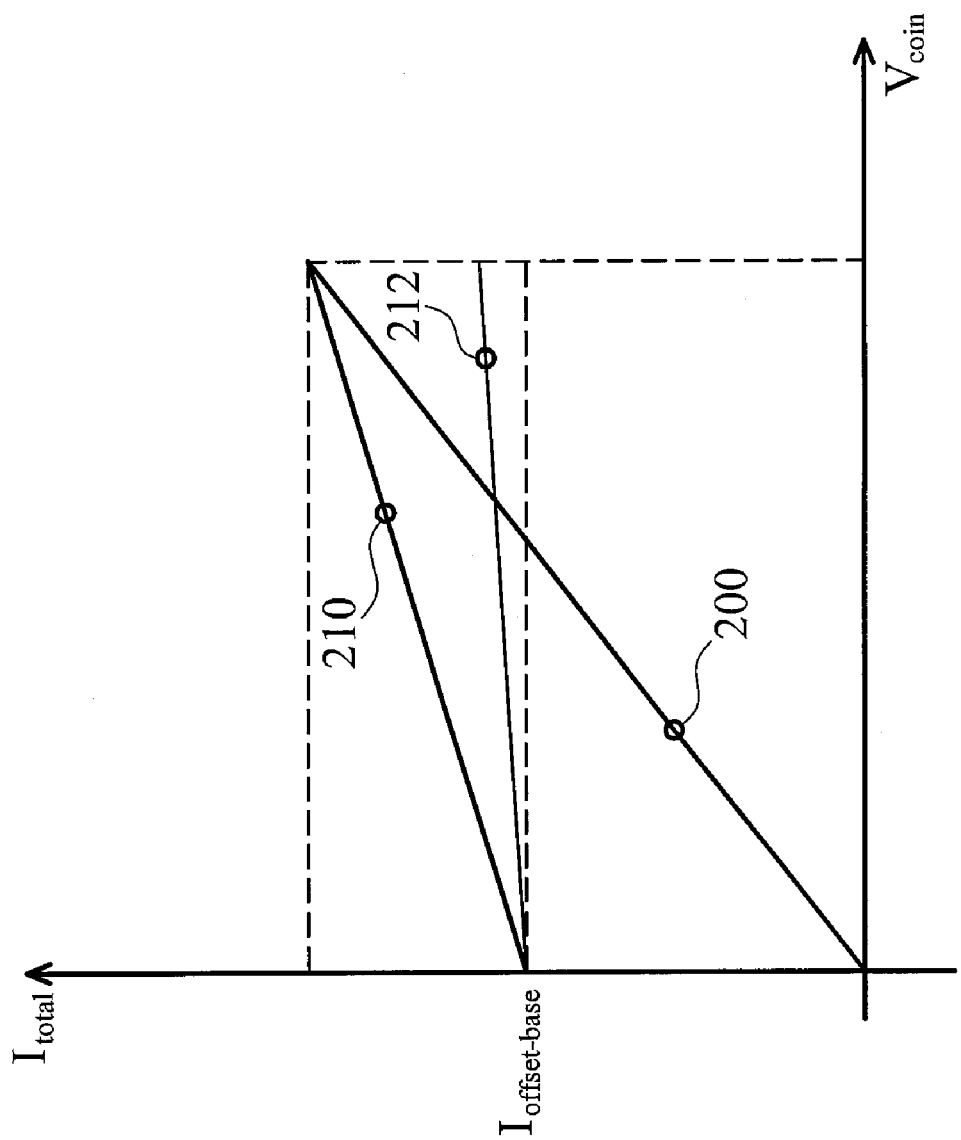
FIG. 5B illustrates the operating characteristics of the VCO illustrated in FIG. 5A.

FIG. 5B is a graph illustrating a comparison between the CCO control current $T_{total}$ (e.g., trace 210) as generated by PLL 100 and the COO control current (e.g., trace 200) of a prior art PLL having a single path configuration, such as that shown in FIG. 1A. Also shown in FIG. 5B is the output current $I_{offset}$ (e.g., trace 212) generated from DVGC 150 of PLL 100. Through the comparison, distinct features of PLL 100 are revealed and advantages may be readily appreciated as the following. First, compared with the significant increase of $I_{total}$ versus $V_{coin}$, $I_{offset}$ 212 output from DVGC 150 provides a current reference that remains nearly unchanged in the desired operating range of $V_{coin}$ due to the large capacitance of C2 of loop filter 130. Moreover, $I_{offset}$ 212 provides a baseline reference current $I_{offset}$ base even when no VCO control signal $V_{coin}$ is presented. Second, in order to achieve a predetermined PLL frequency gain (equivalent to a corresponding current gain of CCO, e.g., slope of trace 200), the current gain of V2I 145 (e.g., slope of trace 210) can be configured substantially smaller than that of a V2I in a prior art VCO without a DVGC unit. This may significantly increase the tuning precision of a PLL.

FIG. 6A compares the tuning precision (PLL output frequency change versus VCO control voltage change, measured in MHz per Volt) of PLL 100 (e.g., trace 230) with a dual path configuration with that (e.g., trace 220) of a prior art PLL having a single path configuration (e.g., without VCO offset current). The tuning precision is typically frequency-dependent. In the current embodiment, an average improvement of about 12.19% is achieved in the PLL operating range of from about 2800 MHz to about 3100 MHz. In another preferred embodiment, a 50% improvement on PLL tuning precision is obtained.

FIG. 6B compares the output frequency jitter (output frequency uncertainty versus VCO control voltage, measured in MHz per Volt) of PLL 100 (e.g., trace 250) with a dual path configuration with that (e.g., trace 240) of a prior art PLL having a single path configuration, such as the PLL illustrated with respect to FIG. 2A. The output frequency jitter is typically frequency-dependent. In the current embodiment, an average improvement of about 12.19% is achieved in the PLL operating range of from about 2800 MHz to about 3100 MHz. In another preferred embodiment, a 50% improvement on PLL output frequency jitter is obtained.

As a further advantageous feature, the reduced VCO gain of PLL 100 may lead to a PLL implemented with on a significantly reduced die size. The operating bandwidth of PLL 100 can be approximated as the following:

$$BW \propto K_{VCO} * \frac{1}{C_2} \quad (4)$$

where BW is the −3 dB bandwidth of PLL 100; $K_{VCO}$ represents the gain of VCO 140; $C_2$ is the capacitance of $C_2$ in low-pass filter 130. It is noted from the above equation that, when $K_{VCO}$ is reduced as in preferred embodiments, BW tends to be reduced by a same proportion. To maintain a predetermined PLL 100 bandwidth, $C_2$ is required to be reduced by a same proportion, resulting in a reduced PLL die size.

As an additional advantageous feature, PLL 100 may be constructed by merging a DVGC unit with a pre-fined-tuned single path PLL. The operational stability of the feedback system of the pre-fine-tuned of a PLL may not be affected. Although an extra zero and pole are created due to the addition of DVGC 150 into an existing PLL system, whereas, the added zero and pole may cancel out each other, leading to a PLL transfer function that is virtually unchanged. As a result, extra circuit elements typically used for frequency compensation may be avoided.

Figure 7:
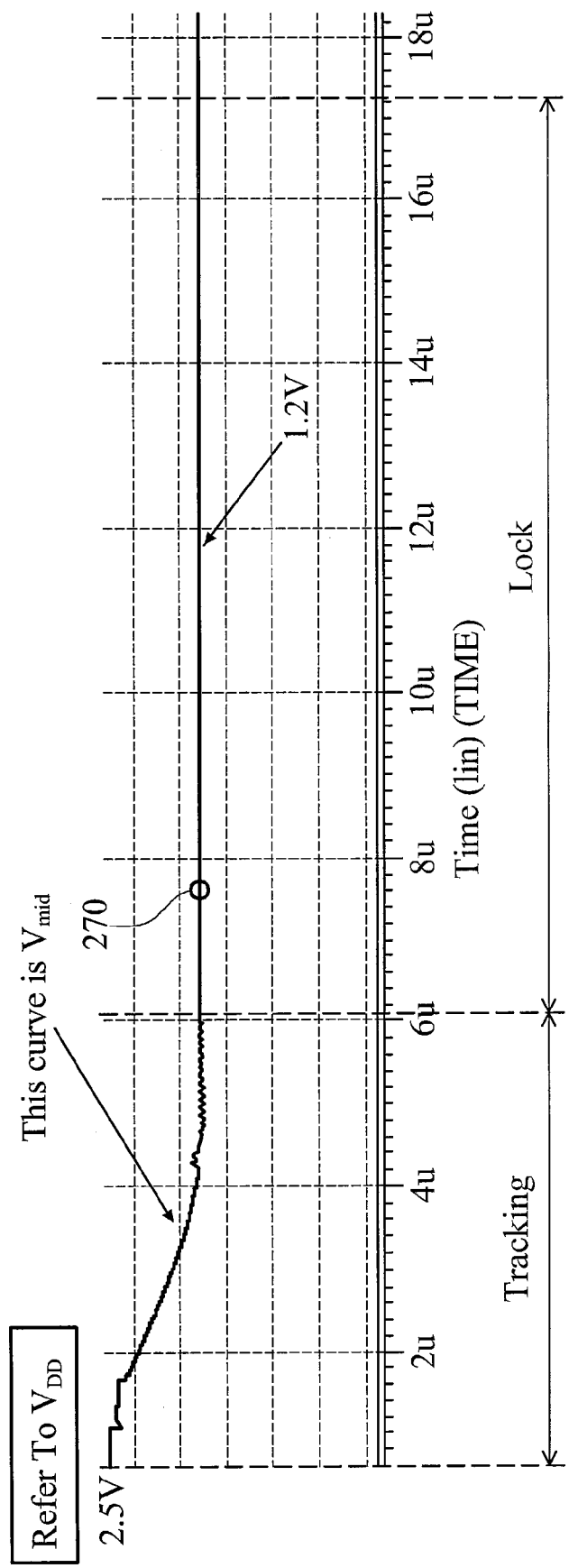
FIG. 7 illustrates the PLL setting behavior of an illustrative embodiment.

FIG. 7 is a graph illustrating the setting behavior (e.g., trace 270) of PLL 100, where DVGC 150 control signal $V_{mid}$ is plotted versus the tracking and lock-in time. When a phase step is presented at phase detector 110, $V_{mid}$ is initiated at an upper bound limit of about 2.5V. It takes about 6 µs (microsecond) tracking time for the PLL output frequency signal $F_{out}$ to be locked with an input signal, while $V_{mid}$ is settled at a lower bound limit of about 1.2V.

Figure 8:
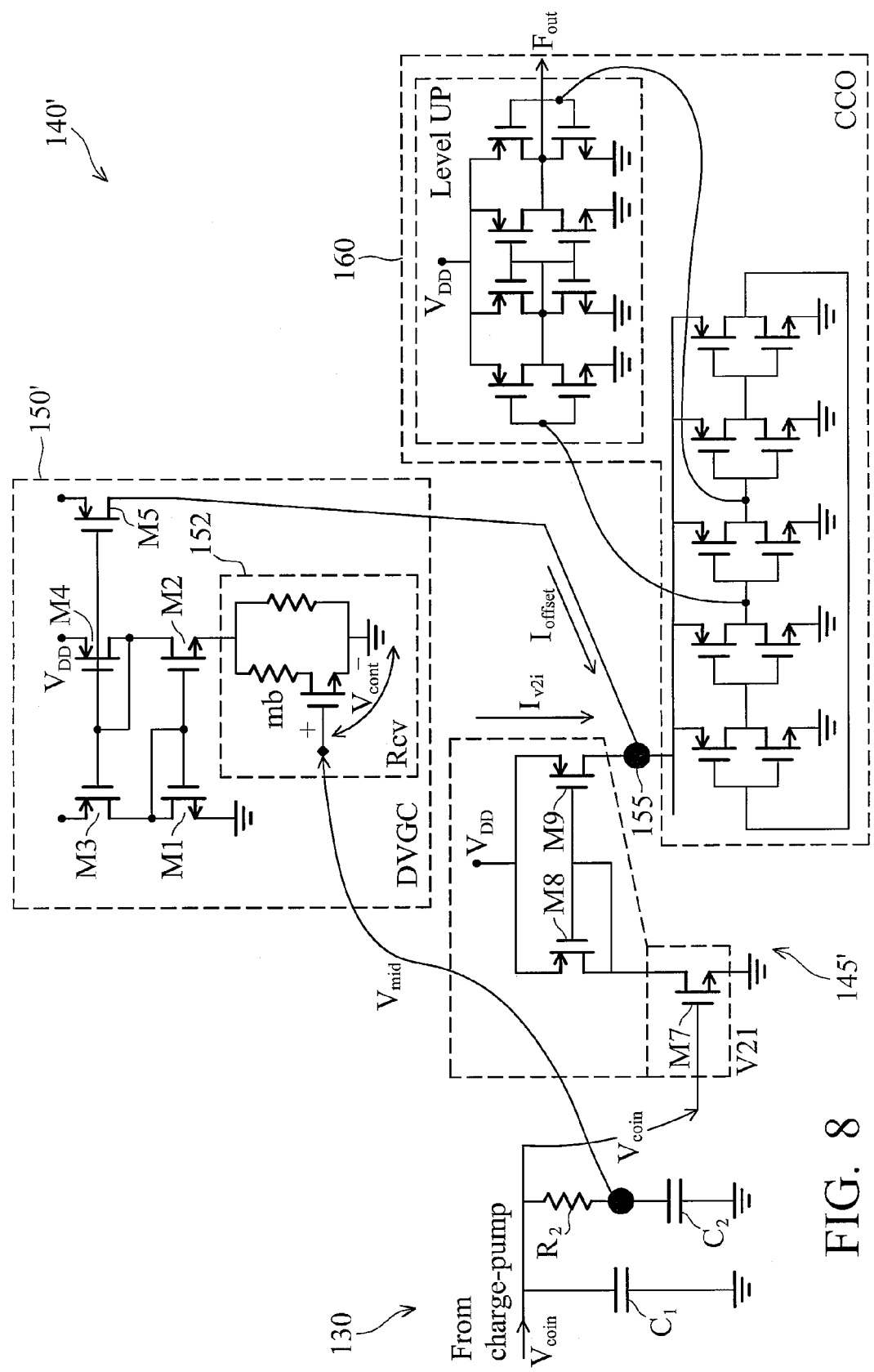
FIG. 8 illustrates a detailed schematic diagram of an voltage-controlled oscillator (VCO) of an illustrative embodiment.

FIG. 8 illustrates a detailed schematic diagram of VCO 140' implemented in another preferred embodiment of the current invention. The configuration of VCO 140' is similar to VCO 140 illustrated with respect to FIG. 5A, but is different in the following. DVGC 150' in the current embodiment comprises variable Rcv that is implemented between the source of NMOSFET M2 and ground. DVGC 150' control signal $V_{cont}$ is the difference between low pass filter 130 output signal $V_{mid}$ and ground (i.e., $V_{cont}=V_{mid}$). $I_{offset}$ generated from DVGC 150' varies in response to $V_{mid}$ presented on the gate of M6, which, in turn, varies in respond to VCO control signal $V_{coin}$ from charge pump 120. In the current DVGC configuration, control voltage $V_{coin}$ is also referred to as being $V_{mid}$ referenced to ground. Also, V2I 145' is implemented to convert the first VCO control signal $V_{coin}$ into a dc current $I_{v2i}$, and comprises an NMOSFET M7 and PMOSFETs M8 and M9. The source of M7 is connected to ground; the gate of M7 is coupled to the first VCO control signal $V_{coin}$. The sources of M8 and M9 are connect the supply voltage $V_{DD}$; the drain of M8 is connected to the drain of M7; the gate and the drain of M8 and the gate of M9 are tied together; the drain of M9 is connected to node 155; and V2I 145' is configured to produce a continuous and substantially linear current $I_{v2i}$ proportional to $V_{coin}$ within the desired operating range of $V_{coin}$, between 0 V and 2.5 V, for example. Similarly, the current $I_{offset}$ generated from DVGC 150' is also coupled to node 155. $I_{v2i}$ and $I_{offset}$ are combined at node 150 to form CCO control current $I_{total}$. $I_{total}$ is subsequently fed into CCO 160 and converted into PLL output frequency signal $F_{out}$.

Figure 9:
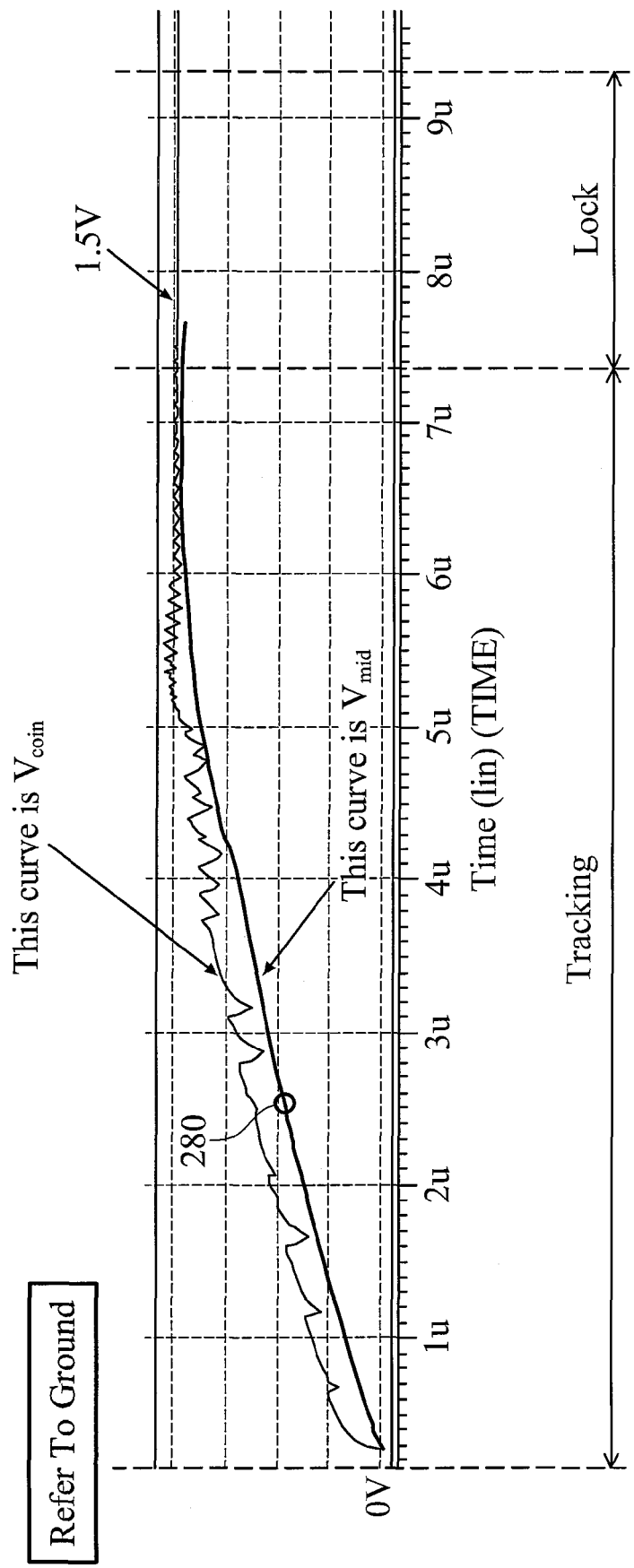
FIG. 9 illustrates the PLL setting behavior of an illustrative embodiment.

FIG. 9 is a graph illustrating the setting behavior (e.g., trace 280) of an embodied PLL comprising VCO 140' illustrated in FIG. 8. DVGC 150' control signal $V_{mid}$ is plotted versus the tracking and lock-in time. When a phase step is presented at phase detector 110, $V_{mid}$ is initiated at a lower bound limit of about 0 V. It takes about 7 µs (microsecond) tracking time for the PLL output frequency signal $F_{out}$ to be locked with an input signal, then $V_{mid}$ is settled at an upper bound limit of about 1.5V.

Figure 10:
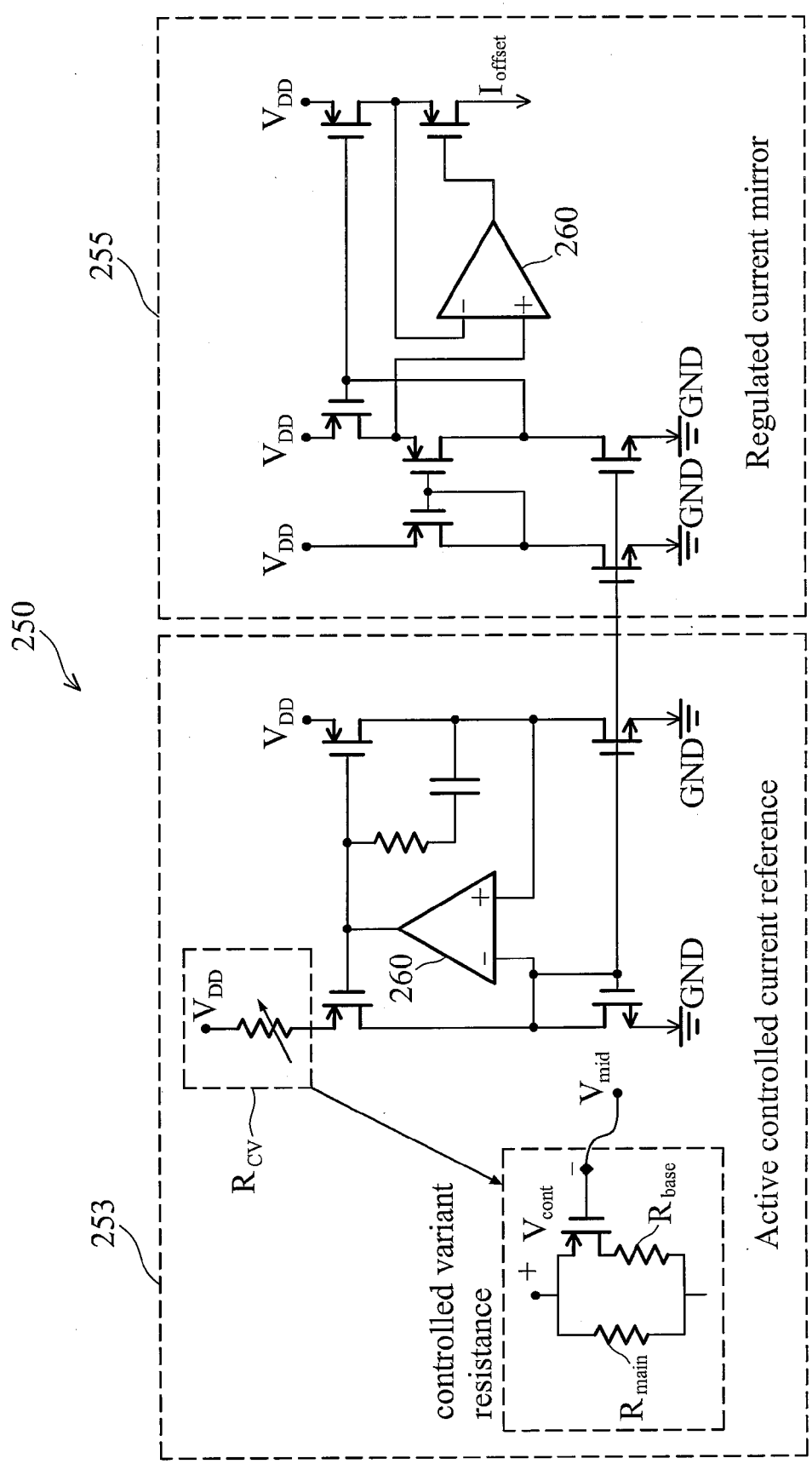
FIG. 10 illustrates a detailed schematic diagram of a DVGC of an illustrative embodiment.

FIG. 10 illustrates a detailed schematic diagram of an enhanced version of a DVGC, namely, DVGC_EN 250 implemented in an additional or alternative embodiment of the present invention. DVGC_EN 250 comprises an active controlled current reference 253 and a current mirror 255 in tandem, each implemented with operational amplifier 260 (OP AMP), among other devices as shown. In the current DVGC_EN configuration, control voltage $V_{cont}$ is referenced to the supply voltage $V_{DD}$. The configuration of DVGC_EN 250 supports a constant—Gm characteristic of the MOS transistors being substantially independent of variations of supply voltage, manufacturing process, and operational temperature. Thus, DVGC_EN 250 provides an improved power noise rejection capability (e.g., measured as power-supply noise rejection ratio, or PSRR) and more stable output reference current $I_{offset}$. The implementation of DVGC_EN 250 is compatible with a CMOS process technology.

Although the present invention and its advantages have been described in detail, it should be understood that various changes, substitutions and alterations can be made herein without departing from the spirit and scope of the invention as defined by the appended claims. As an example, the inventive feature involving a dynamic voltage gain control (DVGC) unit and dual path configuration disclosed in the preferred embodiments may be implemented in applications other than a PLL, where reduced VCO gain and improved VCO tuning precision are desired. As another example, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A phase lock loop (PLL) circuit comprising:
    a phase detector configured to generate a control signal representing a frequency difference between a PLL input signal and an output signal;
    a loop filter configured to generate first and second voltage signals in response to the control signal; and
    a voltage controlled oscillator (VCO) comprising a dynamic voltage gain control (DVGC) circuit, wherein the VCO is configured to modify a frequency of the output signal in response to the first and second voltage signals, and wherein the DVGC circuit is configured to provide an offset signal in response to a voltage amplitude of the first voltage signal.

2. The PLL circuit of claim 1 wherein the DVGC is configured to provide a first current signal as the offset signal to a reference node.

3. The PLL circuit of claim 2 wherein the VCO further comprises a voltage-to-current circuit configured to convert the second voltage signal to a second current signal, and to provide the second current signal to the reference node.

4. The PLL circuit of claim 3 wherein the VCO further comprises a current-controlled oscillator (CCO), the CCO configured to generate the output signal in response to a sum of the first and second current signals at the reference node.

5. The PLL circuit of claim 1 wherein the first and the second voltage signals are generated at first and second terminals, respectively, of a resistive device in the loop filter.

6. The PLL circuit of claim 3 wherein the first current signal has a lower gain than the second current signal in response to the control signal.

7. The PLL circuit of claim 1 wherein the loop filter is a low-pass filter, and the first voltage signal is extracted from a terminal connected to a large capacitance.

8. The PLL circuit of claim 1, wherein the offset signal comprises a first current, and wherein the VCO comprises:
    a voltage-to-current unit configured to generate a second current;
    wherein the first current varies insignificantly in response to the first voltage signal, and wherein the second current varies substantially linearly in response to the second voltage signal.

9. The PLL circuit of claim 8, wherein the VCO further comprises a current-controlled oscillator configured to generate the output signal that varies in response to a sum of the first and the second current signals.

10. The PLL circuit of claim 8 wherein the DVGC circuit comprises a voltage controlled resistor regulating the first current in response to the first voltage signal.

11. The PLL circuit of claim 8 wherein the first and the second voltage signals are extracted from first and second terminals, respectively, of one or more resistive devices in a circuit unit in front of the DVGC circuit.

12. The PLL circuit of claim 11 wherein the circuit unit is the loop filter.

13. A phase lock loop (PLL) comprising:
    a loop filter configured to provide a first and a second voltage signal in response to an input control voltage that is input into the loop filter; and
    a voltage controlled oscillator (VCO) configured to generate a PLL output frequency signal in response to the first voltage signal and the second voltage signal,
    wherein the input control voltage varies in response to a relative phase of a PLL input frequency signal and the PLL output frequency signal.

14. The PLL of claim 13 wherein the first voltage signal is extracted from a node coupled to the input control voltage, and wherein the second voltage signal is extracted from a node coupled to a large capacitance.

15. The PLL of claim 14 wherein the VCO comprises:
    a dynamic voltage gain control (DVGC) unit configured to generate a first current in response to the first voltage signal; and
    a voltage-to-current unit configured to generate a second current in response to the second voltage signal.

16. The PLL of claim 15 wherein the first current varies insignificantly, and wherein there is an offset output frequency signal when there is no frequency difference between the PLL input frequency signal and the PLL output frequency signal.

17. The PLL of claim 15 wherein the DVGC regulates the first current through a circuit comprising a voltage controlled resistor responding to the first voltage signal.

18. The PLL of claim 15 further comprising a current-controlled oscillator (CCO) configured to generate the output frequency signal in response to a sum of the first and the second current.

19. The PLL of claim 15 wherein the DVGC unit has a contact Gm configuration and comprises at least one operational amplifier.

* * * * *

UNITED STATES PATENT AND TRADEMARK OFFICE
CERTIFICATE OF CORRECTION

| | | |
|---|---|---|
| PATENT NO. | : 7,786,771 B2 | Page 1 of 1 |
| APPLICATION NO. | : 12/127651 | |
| DATED | : August 31, 2010 | |
| INVENTOR(S) | : Tsai et al. | |

It is certified that error appears in the above-identified patent and that said Letters Patent is hereby corrected as shown below:

In Col. 10, line 39, claim 15, delete "14" and insert --13--.

Signed and Sealed this

Ninth Day of November, 2010

David J. Kappos
*Director of the United States Patent and Trademark Office*